(12) United States Patent
Kaehs (10) Patent No.: US 8,766,714 B2
(45) Date of Patent: Jul. 1, 2014

(54) AMPLIFIER COMPONENT COMPRISING A COMPENSATION ELEMENT

(75) Inventor: Bernhard Kaehs, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 90 days.

(21) Appl. No.: 13/517,105

(22) PCT Filed: Nov. 30, 2010

(86) PCT No.: PCT/EP2010/007261
§ 371 (c)(1),
(2), (4) Date: Aug. 2, 2012

(87) PCT Pub. No.: WO2011/079899
PCT Pub. Date: Jul. 7, 2011

(65) Prior Publication Data
US 2012/0299656 A1    Nov. 29, 2012

(30) Foreign Application Priority Data

Dec. 28, 2009  (DE) ........................ 10 2009 060 669
Mar. 3, 2010   (DE) ........................ 10 2010 009 984

(51) Int. Cl.
*H03F 1/00* (2006.01)
(52) U.S. Cl.
USPC ............................................ 330/65; 330/269
(58) Field of Classification Search
USPC ................................. 330/65, 269, 307, 305
See application file for complete search history.

(56) References Cited

U.S. PATENT DOCUMENTS

| | | | |
|---|---|---|---|
| 3,713,006 A | 1/1973 | Litty et al. | |
| 4,107,728 A | 8/1978 | Max | |
| 4,456,888 A | 6/1984 | Ayasli | |
| 4,647,867 A * | 3/1987 | Butler et al. | 330/269 |
| 5,066,925 A * | 11/1991 | Freitag | 330/269 |
| 5,623,231 A | 4/1997 | Mohwinkel et al. | |
| 6,462,620 B1 * | 10/2002 | Dupuis et al. | 330/264 |
| 2003/0117219 A1 | 6/2003 | Yamamoto et al. | |
| 2004/0145034 A1 | 7/2004 | Fujioka et al. | |
| 2007/0096816 A1 | 5/2007 | Paul et al. | |
| 2008/0246547 A1 | 10/2008 | Blednov | |
| 2009/0002071 A1* | 1/2009 | Aoki et al. | 330/269 |

FOREIGN PATENT DOCUMENTS

| | | |
|---|---|---|
| WO | 00-033378 | 6/2000 |
| WO | 03-063246 | 7/2003 |
| WO | 2007-003224 | 1/2007 |

OTHER PUBLICATIONS

Ho, Tammy, et al., "A 900 MHz 200 W Silicon LDMOS Power Amplifier Using Integrated Passive Devices in a New Over-Molded Plastic Package," Microwave Symposium Digest, 2009; MTT'09, IEEE MTT-S International, IEEE, Piscatway, New Jersey, USA (Jun. 7, 2009).
Bakalski W., et al., "A Fully Integrated 4.8-6 GHz Power Amplifier With On-Chip Output Balun in 38 GHz-fT Si-bipolar," 2003 IEEE MTT-S International Microwave Symposium Digest. (IMS2003) Philadelphia, Pennsylvania, Jun. 8-13, 2003; [IEEE MTT-S International Microwave Symposium] New York, NY: IEEE, US.

* cited by examiner

*Primary Examiner* — Henry Choe
(74) *Attorney, Agent, or Firm* — Fish & Tsang LLP (57) ABSTRACT

An amplifier component (1) provides a chip housing (40) and at least two amplifier elements ($3_1$, $3_2$). Between at least two connections ($5_1$, $5_2$ and $6_1$, $6_2$) of each amplifier element ($3_1$, $3_2$), a parasitic capacitance ($8_1$, $8_2$) is formed, wherein this parasitic capacitance ($8_1$, $8_2$) is compensated by an inductive compensation element (2). The compensation element (2) itself is formed between two connecting contacts ($10_1$, $10_2$) outside of the chip housing (40) by a connecting lug (2).

15 Claims, 5 Drawing Sheets

AMPLIFIER COMPONENT COMPRISING A COMPENSATION ELEMENT

This application is a national phase of International Application PCT/E2010/007261, which claims the priority of German Patent Application DE 10 2009 060 669.6, filed Dec. 28, 2009, and German Patent Application DE 10 2010 009 984.8, filed Mar. 3, 2010. International Application PCT/E2010/007261, German Patent Application DE 10 2009 060 669.6, and German Patent Application DE 10 2010 009 984.8 are incorporated herein by reference in their entirety.

FIELD OF THE INVENTION

The field of the invention is amplifier technologies.

BACKGROUND

An amplifier component, especially a high-frequency amplifier component, within a chip housing with a compensation element, can be used in communications technology, for example, for the transmission of radio and television signals, in mobile-radio base stations, in computer measurement technology and for scientific purposes in order to generate large high-frequency powers.

The amplifier component is composed substantially of power transistors, which should operate, for example, over several octaves dependent upon the application. The power of the transistor in this context is relatively higher the lower the connected toad resistance. With transistor powers, for example, from 100 W to, for example, 1000 W, the load resistance is disposed within a range from several ohms down to below one ohm. This load resistance must be transferred via a matching network to a system impedance of typically 50 ohms. A parasitic capacitance, which limits the bandwidth of this matching network, is formed at the output of the amplifier component. This parasitic capacitance can be compensated by a compensation element which must provide an inductive behavior. A compensation element of this kind is generally formed by a small shunt inductance which is integrated into the amplifier component.

An amplifier component which provides two bipolar transistors which are arranged in a "push-pull" configuration (push-pull configuration), is known from U.S. Pat. No. 4,107,728, wherein transistor dies (transistor dies), or transistor chips (semiconductor elements) are accommodated in a common chip housing (housing of a semiconductor amplifier). U.S. Pat. No. 4,107,728 is incorporated herein by reference in its entirety. In this context, the parasitic output capacitance is formed between the collector surface and the reference ground, to which the two emitters are also connected. In order to compensate this parasitic output capacitance, a shunt inductance is formed, which connects both collector surfaces to one another within the chip housing. The shunt inductance itself is formed by a thin strip of metal.

The disadvantage with U.S. Pat. No. 4,107,728 is that a relatively large and expensive chip housing forms are necessary for the realization of such an integrated shunt inductance. Furthermore, the shunt inductance extends in places parallel to the bond wires which connect the transistor die to the connecting pins of the collector, thereby forming a coupling. The mutual inductance resulting from the coupling has a disadvantageous effect on the compensation behavior, so that, ultimately, the bandwidth of the matching network is reduced. Moreover, such a shunt inductance which is realized as a printed conductor cannot be applied directly to the flange, but requires an additional insulating layer. Such an insulating layer, which is typically formed from a ceramic or a substrate, is in fact necessarily present with the use of bipolar transistors or DMOS transistors (diffused metal oxide semiconductor; diffused metal oxide semiconductor), however, such an insulating layer is not necessary with the use of other types of transistors and must therefore be additionally applied for this shunt inductance. Thus, there is a need to overcome the aforementioned disadvantages.

SUMMARY OF THE INVENTION

The invention is therefore based upon the object of providing an amplifier component, with which it is possible to compensate the parasitic output capacitance without the need for special and expensive chip-housing forms for the amplifier component. Furthermore, the amplifier component according to the invention should be designed in such a manner that couplings between the shunt inductance and the bond wires which connect the transistor die to the output pins are avoided. Moreover, as a result, the output capacitance of the amplifier component should be compensated in the best possible manner, so that the matching network can be operated with a maximal bandwidth. Ultimately, if possible, no additional insulating layer should have to be applied within the amplifier component.

This object is achieved by an amplifier component with the features of claim 1. The dependent claims provide advantageous further developments of the invention.

In this context, the compensation element is used for the compensation of the parasitic output capacitance of an amplifier component and provides an inductive behavior. The amplifier component itself comprises at least two amplifier elements, wherein the compensation element according to the invention is formed outside the chip housing between two connecting pins connected to the amplifier elements by a connecting tug.

Because the compensation element is arranged outside the chip housing, no special, expensive chip housing needs to be used. Furthermore, the arrangement of the individual component groups within the amplifier housing is simplified by the absence of the compensation element for the amplifier component. The coupling is additionally reduced because the compensation element is arranged outside and therefore remote from the bond wires which connect the transistor die to the connection pins. Furthermore, no extra insulating layer needs to be applied for the compensation element formed as a printed conductor strip within the amplifier component. This means that the parasitic output capacitance can be reliably compensated and the bandwidth of the matching network can be significantly increased and, at the same time, the costs for the amplifier component are reduced.

A further advantage of the invention is that the connecting pins of the chip housing and the compensation element formed as a connecting lug are embodied in one part. This means that the compensation element can be added directly in the manufacturing process for the chip housing and no additional soldering process is necessary. Accordingly, it can be guaranteed that the inductance of each individual compensation element is always of an identical magnitude.

A further advantage of the invention is achieved if the connecting pins of the chip housing provide a bending edge. Accordingly, the compensation element can be bent in such a manner that an angle of preferably 45' to 135', by particular preference of 90° is formed between the compensation element and the connecting pins of the chip housing. This achieves a further reduction of the couplings.

Furthermore, it is advantageous that the compensation element formed as a connecting lug can be separated from the connecting pins of the chip housing at a break-off point or a narrowing. As a result, the same amplifier component can also be used for applications in which such a compensation element would be associated with disadvantages.

Moreover, it is advantageous that the compensation element formed as a connecting lug can be embodied in different ways in order to compensate parasitic output capacitances of different magnitude in a simple manner without having to vary the chip design in every case.

A further advantage of the invention is that the two amplifier elements are power transistors, preferably LDMOS transistors (laterally diffused metal-oxide semiconductor; lateral diffused metal-oxide semiconductor), which are arranged in a so-called push-pull configuration. In this context, a supply voltage of identical magnitude is supplied to the drain connections of both power transistors, so that the compensation element can be arranged in series between the two drain connections without an additional capacitor for direct-voltage de-coupling, thereby avoiding further undesirable resonances.

Various exemplary embodiments of the invention are described by way of example below with reference to the drawings. Identical subject matters provide the same reference numbers.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Figure 1:
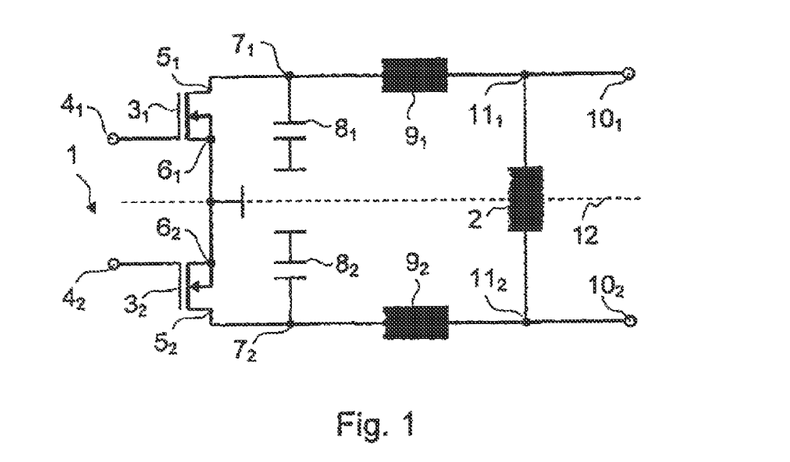
FIG. 1 shows an equivalent circuit diagram of the amplifier component with the compensation element according to the invention.

FIG. 1 shows a circuit diagram (equivalent circuit diagram) of the amplifier component 1 with the compensation element 2 according to the invention. The amplifier component 1 is structured in mirror-image symmetry about the axis 12. The amplifier component 1 provides at least two amplifier elements $3_1$, $3_2$, which are controlled preferably in phase opposition and arranged in a push-pull configuration. The amplifier elements $3_1$, $3_2$ can also be referred to as transistor dies $3_1$, $3_2$. The amplifier component 1 in this context is enclosed in a chip housing which is not illustrated. The amplifier elements $3_1$, $3_2$ preferably provide at least one power transistor, which is preferably a field-effect transistor, especially an LDMOS transistor (laterally diffused metal-oxide semiconductor; laterally diffused metal-oxide semiconductor). Accordingly, a first input connecting contact $4_1$ is preferably connected to the gate of the first amplifier element $3_1$. A second connection $5_1$ is preferably connected to the drain of the first amplifier element $3_1$, and a third connection $6_1$ is preferably connected to the source of the first amplifier element $3_1$.

Furthermore, a first input connecting contact $4_2$ is preferably connected to the gate of the second amplifier element $3_2$. A second connection $5_2$ is preferably connected to the drain of the second amplifier element $3_2$, and a third connection $6_2$ is preferably connected to the source of the second amplifier element $3_2$. The amplifier elements $3_1$, $3_2$ are preferably arranged in a push-pull configuration so that a third connection $6_1$ of the first amplifier element $3_1$ is connected to the third connection $6_2$ of a second amplifier element $3_2$. Both connections $6_1$, $6_2$ are additionally connected to the reference ground.

A second connection $5_1$ of a first amplifier element $3_1$ is connected via the node $7_1$ to a first connection of capacitor $8_1$. A second connection of this capacitor $8_1$ is connected to the reference ground. Furthermore, a second connection $5_2$ of the amplifier element $3_2$ is connected via the node $7_2$ to a first connection of the capacitor $8_2$. A second connection of the capacitor $8_2$ is connected to the reference ground. Both capacitors $8_1$, $8_2$ are formed by parasitic output capacitances $8_1$, $8_2$, which are formed between the drain and source surfaces of the amplifier elements $3_1$, $3_2$. If these parasitic output capacitances $8_1$ and $8_2$ are not compensated, the bandwidth of the matching network, which is not illustrated, is significantly reduced.

The node $7_1$ is a further connected to a first connection of an inductance $9_1$. The second connection of the inductance $9_1$ is connected to the node $11_1$. The node $11_1$ is connected to the connecting contact $10_1$ of a chip housing, which is not illustrated. Corresponding to the mirror-image symmetrical structure about the access 12, the node $7_2$ is connected to a first connection of the inductance $9_2$. The second connection of the inductance $9_2$ is connected to the node $11_2$. The node $11_2$ is connected to the connecting contact $10_2$ of the chip housing, which is not illustrated. Both inductances $9_1$ and $9_2$ are formed by printed conductor strips and/or bond wires, which connect the second connections $5_1$, $5_2$ of the amplifier elements $3_1$, $3_2$ to the connecting contacts $10_1$, $10_2$ of the chip housing, which is not illustrated.

A further inductance 2 connects together the two nodes $11_1$ and $11_2$ and therefore the connecting contacts $10_1$ and $10_2$ of the chip housing, which is not illustrated. This inductance 2 is formed as a shunt inductance and is used to compensate the parasitic capacitances $8_1$, $8_2$ for the operating frequency. This inductance 2, which is also referred to as the compensation element 2, is designed as a connecting lug 2 between the two connecting contacts $10_1$ and $10_2$ outside the chip housing, as will be explained in greater detail below. Two drain connections of the power transistors are preferably connected to one another via the compensation element 2. In this context, the compensation element 2 provides an inductive behavior.

As a result of the measure that the compensation element 2 is mounted outside the amplifier component 1, the required chip surface can be reduced. Accordingly, special chip housing forms are not required. Furthermore, couplings between the compensation element 2 with the bond wires and/or other printed conductor strips within the chip housing are avoided. This has an advantageous effect on the attainable bandwidth of the matching network. Overall, development costs are reduced and, at the same time, reduced production costs are achieved.

As a result of the fact that the amplifier elements $3_1$, $3_2$ are arranged in a push-pull configuration and, in each case, the second connections $5_1$ and $5_2$ of the amplifier elements $3_1$, $3_2$ are operated with the same supply voltage, a further capacitance need not be connected in series to the compensation element 2 for the direct-voltage de-coupling, thereby avoiding additional undesirable resonances. The supply voltages at a first connection $4_1$, $4_2$, which is preferably connected to the gate of the amplifier element $3_1$, $3_2$, and the supply voltages at a second connection $5_1$, $5_2$, which is preferably connected to the drain of the amplifier element $3_1$, $3_2$, have not been shown in FIG. 1 for reasons of visual clarity.

Figure 2:
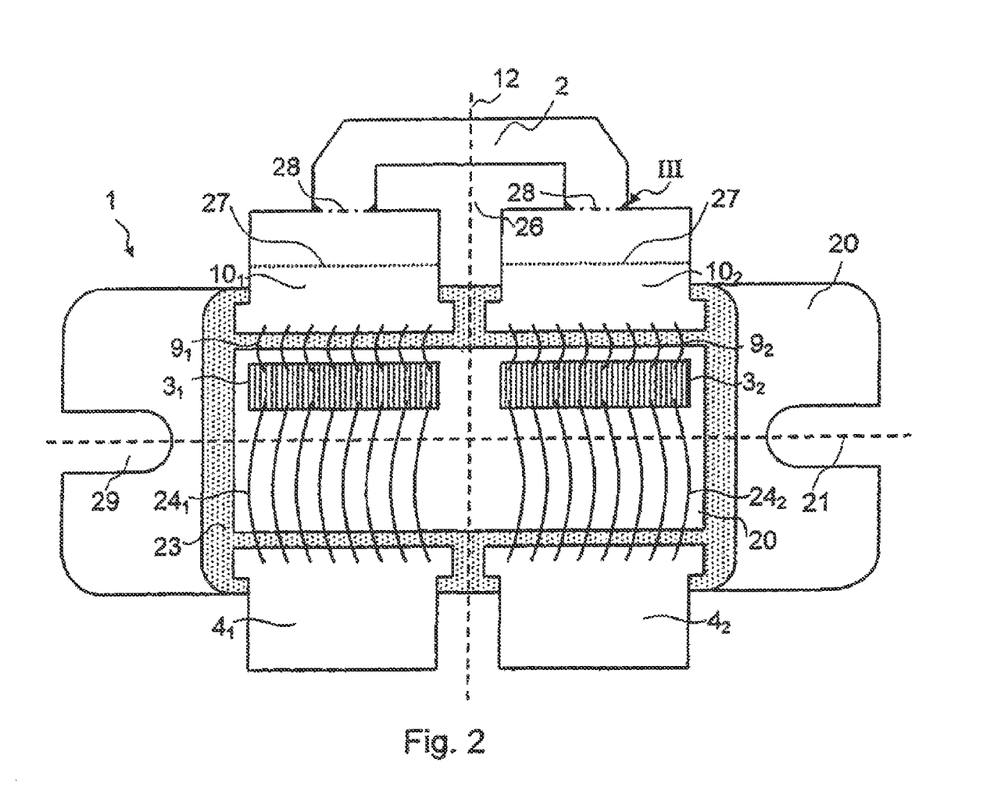
FIG. 2 shows a plan view of the open amplifier component with the compensation element according to the invention.

FIG. 2 shows a plan view of the open amplifier component 1 with the compensation element 2 according to the invention. As already shown in FIG. 1, the amplifier component 1 is structured in exact mirror-image symmetry along the axis 12. The amplifier component 1 is attached to a rectangular base element, preferably on a flange 20, wherein the corners of the flange 20 are rounded. The two indentations 29 of the flange 20 are formed along the longitudinal axis 21, which extends centrally through the flange 20 and stands orthogonally to the axis 12 at the centre point. The flange 20 is attached to a cooling element, which is not illustrated, via a fixing, for example, a screw connection, which is not illustrated.

An insulating layer 23 is formed on the flange 20. This insulating layer 23 is formed in a ring shape, wherein other shapes are also conceivable. The insulating layer 23 comprises a ceramic or a substrate. At least two input connecting contacts $4_1$ and $4_2$ are arranged on this insulating layer 23 parallel to the longitudinal axis 21 at one end. A part of the input connecting contacts $4_1$ and $4_2$ projects beyond the base surface of the flange 20. The input connecting contacts $4_1$ and $4_2$ are designed in a rectangular shape or T-shape, wherein both are preferably formed in an identical manner in order to reduce manufacturing costs and guarantee a symmetrical behavior. Parallel to the input connecting contacts $4_1$ and $4_2$, the connecting contacts $10_1$ and $10_2$ are arranged on the opposite side of the flange 20. The connecting contacts $10_1$ and $10_2$ preferably provide the same base surface, and the input connecting contacts $4_1$ and $4_2$ and are also formed on the insulating layer 23.

The rectangular transistor dies $3_1$, $3_2$ or transistor chips $3_1$, $3_2$ are arranged parallel to the connecting contacts $10_1$ and $10_2$ directly on the flange 20. In this context, the transistor dies $3_1$, $3_2$ are connected by a soldered or glued connection to the flange. In order to achieve the best possible compensation of the parasitic capacitances $8_1$, $8_2$ by the compensation element 2 disposed outside the chip housing, it should be taken into consideration that the transistor dies $3_1$, $3_2$ are arranged as close as possible to the connecting contacts $10_1$ and $10_2$ of the chip housing. This ensures that the bond wires $9_1$, $9_2$ are, on one hand, as short as possible and therefore of low inductance, and, on the other hand, do not couple with the shunt inductance. An optimum thermal transfer is guaranteed because both amplifier elements or respectively transistor dies $3_1$, $3_2$ are connected directly to the flange 20.

The input connecting contact $4_1$ is connected via at least one bond wire $24_1$ to the transistor die $3_1$ and preferably therefore to the gate of the amplifier element $3_1$. Via at least one further bond wire $9_1$, the connecting contact $10_1$ is connected to the transistor die $3_1$ and preferably therefore to the drain of the amplifier element $3_1$. The source of the amplifier element $3_1$ is connected via the underside of the transistor die $3_1$ directly or via a soldered or glued connection to the flange 20 and therefore to the reference ground. The same applies to the amplifier element $3_2$. The input connecting contact $4_2$ is connected via at least one bond wire $24_2$ to the transistor die $3_2$ and preferably therefore to the gate of the amplifier element $3_2$. Via at least one further bond wire $9_2$, the connecting contact $10_2$ is connected to the transistor die $3_2$ and preferably therefore to the drain of the amplifier element $3_2$. The source of the amplifier element $3_2$ is connected via the underside of the transistor die $3_2$ directly or via a soldered or glued connection to the flange 20 and therefore to the reference ground and to the source of the amplifier element $3_1$.

As a result of the fact that LDMOS transistors are preferably used, the transistor die $3_1$, $3_2$ can accordingly be formed directly or via a soldered or glued connection on the flange 20. The source of the LDMOS transistor is accordingly connected directly in an electrically conductive manner to the flange 20. An insulating layer between the transistor die and the flange, as shown in U.S. Pat. No. 4,107,728, is therefore not necessary, for which reason the manufacturing costs are further reduced. If the compensation element 2 is formed in the chip housing, such an insulating layer must first be created on the flange 20, which once again increases the production costs. However, if the compensation element 2 is arranged according to the invention outside of the chip housing, the chip design can, by contrast, be kept simple.

The two connecting contacts $10_1$ and $10_2$ are connected to one another via the compensation element 2, which is formed as a connecting lug 2. The connecting lug 2 in this context is designed in a bow shape. A T-shaped recess 26 is disposed between the connecting lug 2 and the connecting contacts $10_1$ and $10_2$. At least one corner of the bow shaped connecting lug 2 is beveled in this exemplary embodiment. By preference, the connecting lug 2 and at least two connecting contacts $10_1$ and $10_2$ of the chip housing are formed in one piece. This has an advantageous effect on the manufacturing process of the connecting lug 2 and of the two connecting contacts $10_1$ and $10_2$. These can preferably be manufactured in a single punching process. The compensation element 2 formed as a connecting lug 2 accordingly provides reproducible values.

If the compensation element 2 formed as a connecting lug 2 were to be embodied as a separate component, this would have to be connected by means of a further soldering process to the connecting contacts $10_1$ and $10_2$. This would have to be implemented after fitting the amplifier components 1 in the overall circuit, wherein the compensation of the parasitic capacitances $8_1$ and $8_2$ would then take place with a different quality. Alongside increased production costs, no amplifier component 1 would provide exactly the same performance as the others. This means that the bandwidth of the matching network, which is not illustrated, varies considerably. As a result of the one-piece embodiment of the compensation element 2 together with the connecting contacts $10_1$, $10_2$, the amplifier component 1 can be arranged automatically on a printed-circuit board together with its compensation element 2 formed as a connecting lug 2 and, for example, soldered using re-flow technology.

Furthermore, a bending edge 27 is preferably formed in the lower third of at least two connecting contacts $10_1$ and $10_2$ of the chip housing. The bending edge 27 is illustrated by a dotted line in FIG. 2. This bending edge 27 is preferably formed through a punching process. As a result of the bending edge 27, the connecting lug 2 can very simply be orientated within an angular range from, for example, 45° to, for example, 135° relative to the connecting contacts $10_1$ and $10_2$ of the chip housing. By preference, the connecting lug 2 is orientated at an angle of 90° relative to the connecting contacts $10_1$, $10_2$ of the chip housing. This orientation can be achieved very simply in one additional assembly step. As a result of the fact that the connecting lug 2 is preferably orientated at an angle of 90° relative to the connecting contacts $10_1$, $10_2$ of the chip housing, the amplifier component 1 can be integrated in a space-saving manner onto the printed-circuit board, which is not illustrated. Further components can be positioned directly on the connecting contacts $10_1$ and $10_2$. Furthermore, the magnetic couplings are further minimized at an angle of 90° between the connecting lug 2 and the bond wires $9_1$, $9_2$. The parasitic capacitances $8_1$, $8_2$ can accordingly be very well compensated, thereby increasing the bandwidth of the matching network. As a result of the fact that the bending edge is formed in the lower third of the connecting contacts $10_1$, $10_2$, the compensation element 2 is disposed even closer to the transistor die $3_1$, $3_2$.

Furthermore, a break-off point 28, at which the connecting lug 2 can be separated from the connecting contacts $10_1$, $10_2$ of the chip housing, is preferably provided. As will be explained below, this break-off point 28 is formed at the narrowing between the connecting contact $10_1$, $10_2$ of the chip housing and the connecting lug 2. By separating the compensation element 2 formed as a connecting lug 2, the amplifier component 1 can also be used in applications in which a connection between the connecting contact $10_1$, $10_2$ would be disadvantageous as a result of such a shunt inductance 2. This makes the amplifier component 1 useful in a versatile manner, wherein costs for the storage of various amplifier components 1 can be saved.

FIG. 2 shows clearly that the space requirement within the amplifier component 1 can be significantly reduced, as soon as the compensation element 2 is arranged outside the amplifier component 1. As a result, significantly shorter bond-wire lengths and accordingly reduced parasitic series inductances $9_1$, $9_2$ from the amplifier elements $3_1$, $3_2$ to the connecting contacts $10_1$, $10_2$ can be realized. This reduces the cost of the amplifier component 1 and, in addition to the reduced magnetic couplings, means that the amplifier component 1 can be used in a very versatile manner.

FIG. 3 once again illustrates the possibility of how the connecting lug 2 can be separated from the connecting contacts $10_1$, $10_2$. For this purpose, small notches 30, which assume the shape, for example, of triangles, are preferably formed at the transition or respectively the narrowing between the connecting contacts $10_1$, $10_2$ and the connecting lug 2. A cutting tool, such as a knife or scissors can be applied to these notches 30. A break-off point 28, along which the connecting lug 2 can be separated from the connecting contacts $10_1$, $10_2$, is illustrated with dotted lines. This break-off point 22 can also be designed to be perforated, so that the connecting lug can be separated without the use of cutting tools by bending along the break-off point 28 several times. Similarly, it is possible to separate the connecting lug 2 through a further punching process. This has the advantage that the amplifier component 1 can also be used in applications, which do not require an additional compensation element 2.

Figure 4:
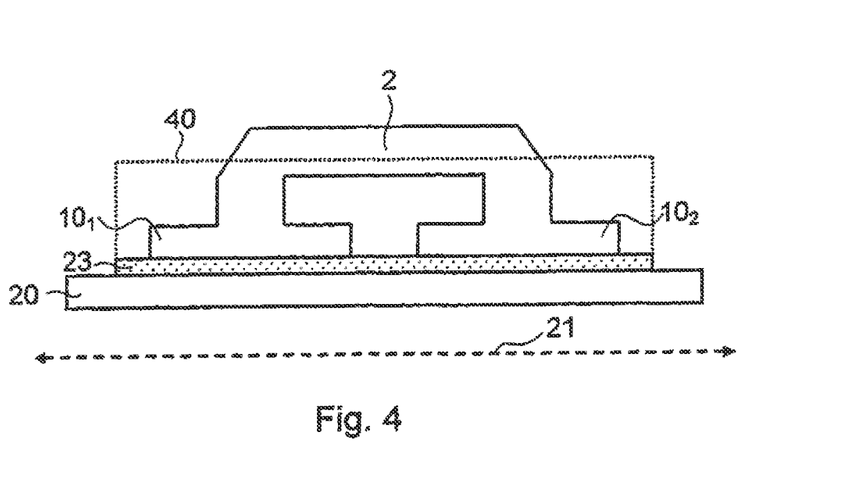
FIG. 4 shows a front view of a first exemplary embodiment of the compensation element in a condition ready for assembly.

FIG. 4 shows a front view along the longitudinal axis 21 of the amplifier component 1 in the condition ready for assembly. The compensation element 2 formed as a connecting tug 2 is bent upwards together with a part of the connecting contacts $10_1$, $10_2$ at the bending edge 27 through approximately 90° in the direction towards the cover of the chip housing 40. It is evident how the amplifier component 1 is formed on the flange 20, which serves as a base surface and for the connection to the reference ground. An insulating layer 23 formed in a ring shape is illustrated as a dotted area. The bent part of the connecting contacts $10_1$, $10_2$ and the connecting lug 2 are shown above the insulating layer 23. The cover of the chip housing 40 of the amplifier component 1 is illustrated by a dotted line. It is evident that the connecting lug 2 is higher than the cover of the chip housing 40.

In one exemplary embodiment, which is not illustrated, the connecting lug 2 can be lower than the cover of the chip housing 40. The connecting lug in FIG. 4 provides the same bow-shaped embodiment as in FIGS. 2 and 3. The break-off point 28 from FIG. 3 has not been shown in FIG. 4 for reasons of visual clarity. In the case of FIG. 4, it is also possible to separate the connecting lug 2 from the connecting contact $10_1$ and $10_2$ at the narrowing.

In order to compensate parasitic capacitances $8_1$, $8_2$ of this magnitude with a compensation element 2, it is necessary that the shape of the connecting lug 2 can be adapted, because the shape of the connecting lug 2 directly determines the inductance of the correction element 2.

FIG. 5 once again shows a front view along the longitudinal axis 21 of the amplifier component 1 in the condition ready for assembly. The compensation element 2 formed as a connecting lug 2 is bent upwards together with a part of the connecting contacts $10_1$, $10_2$ at the bending edge 27 through 90° in the direction of the cover of the chip housing 40. It is evident how the amplifier component 1, which serves as a base surface and for the reference-ground connection, is formed on the flange 20. An insulating layer 23 formed in a ring shape is illustrated as a dotted area on the flange 20. The bent part of the connecting contacts $10_1$, $10_2$ and the connecting lug 2 can be seen above the insulating layer 23. The cover of the chip housing 40 of the amplifier component 1 is illustrated by a dotted line. By contrast with the known connecting lug 2 from FIGS. 2, 3 and 4, the connecting lug 2 provides rounded corners.

Figure 3:
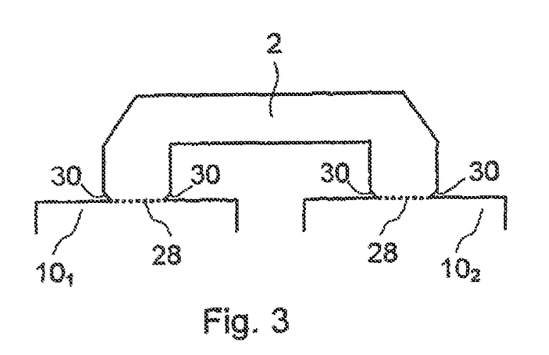
FIG. 3 shows a detail view of the break-off point of the compensation element according to the invention of the amplifier component.
Figure 5:
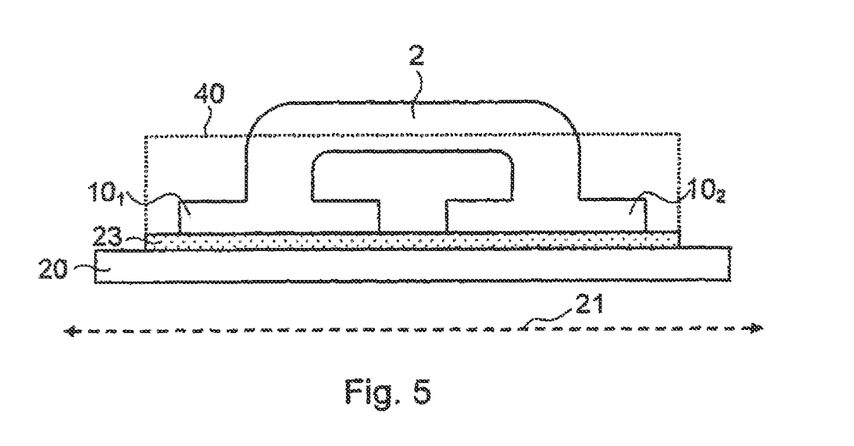
FIG. 5 shows a front view of a second exemplary embodiment of the compensation element in a condition ready for assembly.

The compensation element 2 formed as a connecting lug 2 from FIG. 5 can also be manufactured in a punching process. The break-off point 28 from FIG. 3 is not illustrated in FIG. 5 for reasons of visual clarity. In FIG. 5, it is also possible to separate the connecting lug 2 from the connecting contacts $10_1$ and $10_2$ using the known methods.

Figure 6:
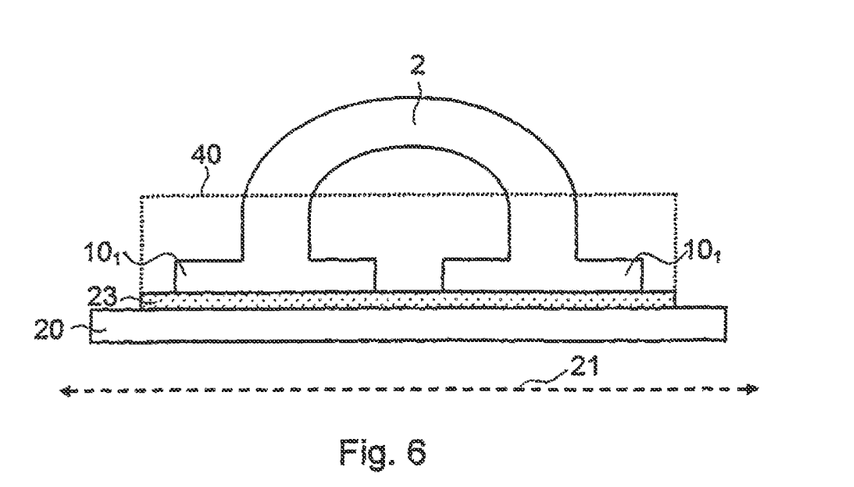
FIG. 6 shows a front view of a third exemplary embodiment of the compensation element in a condition ready for assembly.

FIG. 6 also shows a front view along the longitudinal axis 21 of the amplifier component 1 in the condition ready for assembly, wherein the compensation element 2 provides a further embodiment. The compensation element 2 formed as a connecting lug 2 is bent upwards together with a part of the connecting contacts $10_1$, $10_2$ at the bending edge 27 through 90° in the direction towards the cover of the chip housing 40. It is evident how the amplifier component 1, which serves as a base surface and for the reference-ground connection, is formed on the flange 20. An insulating layer 23 formed in a ring shape on the flange 20 is illustrated as a dotted area. The bent part of the connecting contacts $10_1$, $10_2$ and the connecting lug 2 can be seen above the insulating layer 23. The cover of the chip housing 40 of the amplifier component 1 is illustrated by a dotted line. By contrast with the connecting lug 2 from FIGS. 2, 3, 4 and 5, the connecting lug 2 provides a strongly curved shape. In this context, the connecting lug 2 can form a semicircle, wherein the radius can be selected in such a manner that the compensation element 2 projects far beyond the cover of the chip housing 40 or not.

The compensation element 2 formed as a connecting lug 2 from FIG. 6 can also be manufactured in a punching process. The break-off point 28 from FIG. 3 has not been illustrated in FIG. 6 for reasons of visual clarity. In FIG. 6, it is also possible to separate the connecting lug 2 from the connecting contacts $10_1$ and $10_2$ using the known methods.

Figure 7:
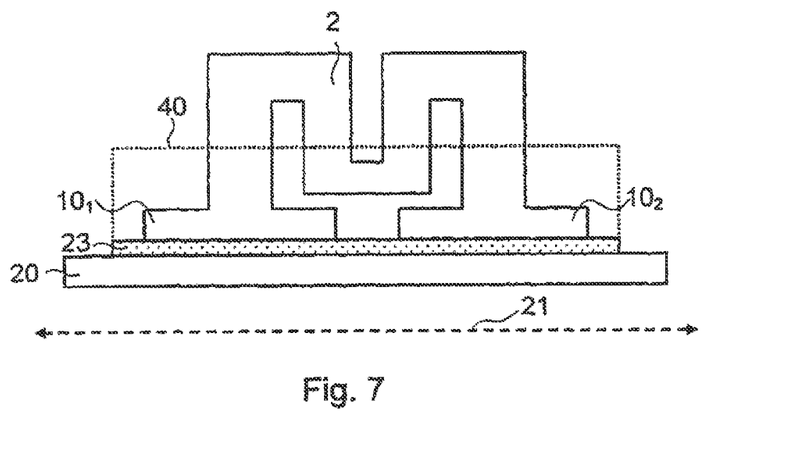
FIG. 7 shows a front view of a third exemplary embodiment of the compensation element in a condition ready for assembly.

FIG. 7 also shows a front view along the longitudinal axis 21 of the amplifier component 1 in a condition ready for assembly, wherein the compensation element 2 provides another embodiment. The compensation element 2 formed as a connecting tug 2 is bent upwards together with apart of the connecting contacts $10_1$, $10_2$ at the bending edge 27 through 90° in the direction towards the cover of the chip housing 40. It is evident how the amplifier component 1, which serves as a base surface and for the reference-ground connection, is formed on the flange 20. An insulating layer 23 formed in a ring shape on the flange 20 is illustrated as a dotted area. The bent part of the connecting contacts $10_1$, $10_2$ and the connecting lug 2 can be seen above the insulating layer 23. The cover of the chip housing 40 of the amplifier component 1 is illustrated by a dotted line. By contrast with the known connecting lugs 2 from FIGS. 2, 3, 4, 5 and 6, the connecting lug 2 provides a meandering embodiment. The connecting lug comprises substantially three U-shaped segments disposed in a row with one another, wherein the corners are rectangular in each case. As a result of this meandering embodiment, the inductance of the compensation element 2 is increased. Accordingly, even relatively large parasitic capacitances $8_1$, $8_2$ can be compensated in a reliable manner.

The compensation element 2 formed as a connecting lug 2 from FIG. 7 can also be manufactured in a punching process. The break-off point from FIG. 3 has not been illustrated in FIG. 7 for reasons of visual clarity. In FIG. 7, it is also possible to separate the connecting lug 2 from the connecting contacts $10_1$ and $10_2$ using the known methods. In another embodiment, which is not illustrated, the corners of the connecting lug 2 designed in a meandering shape are rounded.

Figure 8:
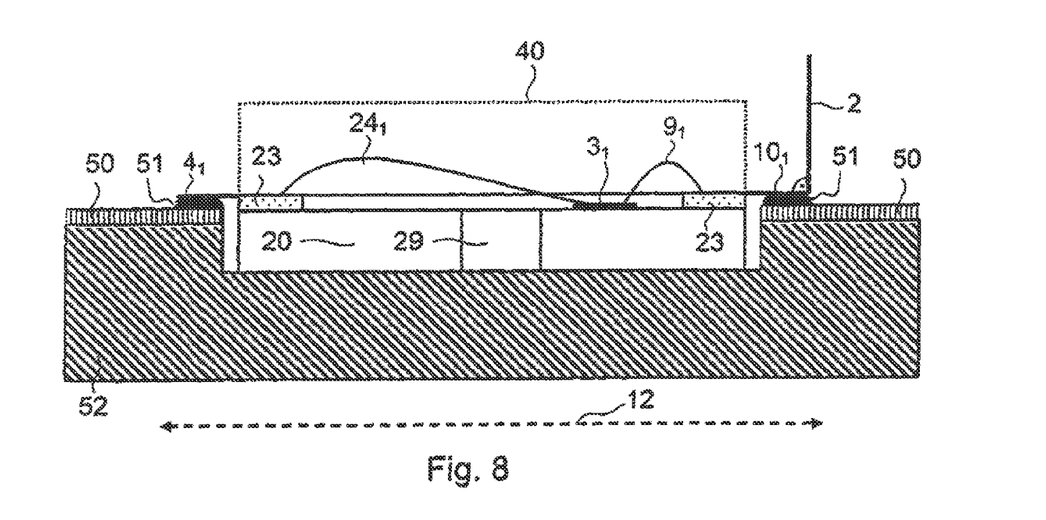
FIG. 8 shows a lateral view of the amplifier component with the compensation element according to the invention in the assembled condition.

FIG. 8 shows a sectional, lateral view of the amplifier component 1 along the axis 12 with the compensation element 2 according to the invention in the assembled condition. In this context, a cooling element 52 provides a rectangular recess. A printed-circuit board 50 is attached to the cooling element 52 with the exception of the rectangular recess. The amplifier component 1, which is formed together with the compensation element 2 according to the invention on the flange 20, is arranged in the recess of the cooling element in such a manner that the latter is connected rigidly to the cooling element 52 via the indentations 29 of the flange 20, for example, by means of a screw connection, which is not illustrated. For this purpose, the cooling element 52 provides corresponding boreholes.

The connection between the flange 20 and the cooling element 52 must be embodied in such a manner that the thermal resistance is as small as possible, in order to remove the waste heat, which arises in a push-pull configuration and which is not negligible during operation, safely from the chip housing 40. In addition to a good thermal conductivity, the transition between the flange 20 and the cooling element 52 must also provide very good electrical conductivity, because a third connection $6_1$, $6_2$ of the amplifier elements $3_1$, $3_2$ is connected through the latter to the reference ground. The source of the LDMOS transistor is preferably connected to the reference ground via the flange 20.

Furthermore, the input connecting contact $4_1$, which connects the amplifier component 1 to the printed-circuit board 50, is illustrated. At the connecting position with the input connecting contact $4_1$, the printed-circuit board 50 provides a contact surface, which is not illustrated, on which a soldering means 51, which preferably provides a paste-like consistency, is applied by means of a dispenser unit. In a soldering process, the input connecting contact $4_1$ is connected to the printed-circuit board 50 in such a manner that a low-ohmic electrical contact is achieved.

FIG. 8 also shows how the input connecting contact $4_1$ is connected via the bond wire $24_1$ to the amplifier element $3_1$ or respectively the transistor die $3_1$. In this context, the amplifier element $3_1$ or the transistor die $3_1$ is still connected to the connecting contact $10_1$ via the bond wire $9_1$. As illustrated in the preceding drawings, a compensation element 2 provided as a connecting lug 2 is formed on the connecting contact $10_1$. This compensation element 2 is bent at a bending edge 27, which is not illustrated in FIG. 8, in the direction of the cover of the chip housing 40, in such a manner that an angle of approximately 90° is formed between the compensation element 2 provided as a connecting lug 2 and the connecting contact $10_1$. In general, the compensation element 2 cart also be bent with a different angle. An angular range from 45° to 135° can be considered in this context. However, the magnetic couplings between the compensation element 2 designed as a connecting lug 2 and the bond wires $9_1$, $9_2$ are smallest with an angle of 90°.

The connecting contact $10_1$ is connected to the printed-circuit board 50. For this purpose, the printed-circuit board 50 provides a contact surface, which is not illustrated, at the connecting position with the connecting contact $10_1$, to which a soldering means 51, which preferably provides a paste-like consistency, is applied by means of a dispenser unit. The connecting contact $10_1$ is connected to the printed-circuit board 50 in a soldering process in such a manner that a low-ohmic electrical contact is achieved.

An insulating layer 23, on which the input connecting contact $4_1$ and the connecting contact $10_1$ are formed, is also shown. The amplifier element $3_1$, or respectively the transistor die $3_1$ is disposed directly on the flange 20. The cover of the chip housing 40 is illustrated as a dotted line. A printed-circuit board 50 can be fitted automatically with the amplifier component 1. At the beginning of the manufacturing process, a screw connection is preferably inserted only in order to achieve an improved thermal transfer and an improved electrical contact between the flange 20 and the cooling element 52. Utile screw connection were to be attached at the end of the manufacturing process, this would lead to mechanical stresses at the soldered joints. The flange can be gold-plated in order to achieve the most low-ohmic contact possible. In order to achieve a permanent rigidity between the input connecting contacts $4_1$, $4_2$ and respectively the connecting contacts $10_1$, $10_2$ and the printed-circuit board 50, gold-plated contacts should not be used here. Exactly the same factors apply for the second side, which is not illustrated, with the input connecting contact $4_2$, the bond wires $9_2$, $24_2$, the amplifier element $3_2$ or respectively the transistor die $3_2$ and the connecting contact $10_2$.

Figure 9:
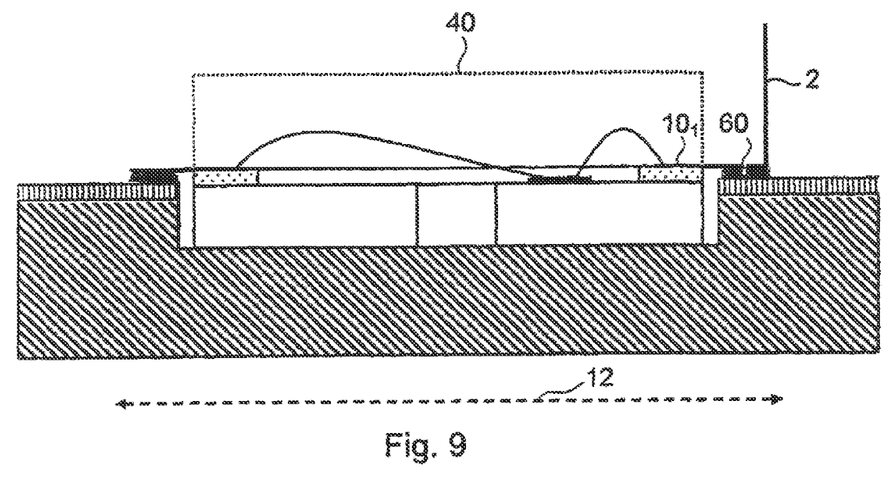
FIG. 9 shows a lateral view of a further exemplary embodiment of the amplifier component with the compensation element according to the invention in the assembled condition.

In a further exemplary embodiment, FIG. 9 shows a lateral view of the amplifier component 1 along the axis 12 with the compensation element 2 according to the invention in the assembled condition. The structure and functioning of the amplifier component 1 has already been explained in detail in the descriptions of the preceding drawings, to which reference is now made. The difference between FIG. 9 and FIG. 8 is that the connecting contact $10_1$ in FIG. 9 provides a hollow-groove embodiment 60, of which the opening faces in the direction towards the chip housing 40. The hollow-groove embodiment 60 here provides a depth, which is disposed within the range from, for example, below one millimeter up to at least one millimeter. The hollow-groove embodiment 60 can be formed in the connecting contact 10$_1$ by a punching process, wherein a greater connecting strength is achieved in the soldering process. This hollow-groove embodiment 60 is also present in the connecting contact 10$_2$, which is not illustrated. Furthermore, the input connecting contacts 4$_1$ and 4$_2$ can also be provided with such a hollow-groove embodiment 60.

The invention is not restricted to the exemplary embodiments presented. All of the elements described and/or illustrated can be combined with one another as required within the framework of the invention. For example, bipolar transistors can also be used.

What is claimed is:

1. An amplifier component with a housing and at least two amplifier elements,
    wherein, a parasitic capacitance is formed between at least two connections of each amplifier element,
    wherein the parasitic capacitance is compensated by an inductive compensation element,
    wherein the compensation element is formed between two connecting contacts outside the housing by a connecting lug,
    wherein a shape of the connecting lug determines the inductance of the compensation element.

2. The amplifier component according to claim 1, wherein at least two connecting contacts of the housing provide a bending edge.

3. The amplifier component according to claim 2, wherein the connecting lug is angled on the bending edge within an angular range from 45° to 135° relative to the connecting contacts of the housing.

4. The amplifier component according to claim 1, wherein the connecting lug and the two connecting contacts of the housing are formed in one piece.

5. The amplifier component according to claim 4, wherein the connecting lug and the connecting contacts are manufactured together in a punching process.

6. The amplifier component according to claim 4, wherein a break-off point is provided, at which the connecting lug can be separated from the connecting contacts of the housing.

7. The amplifier component according to claim 1, wherein the connecting lug is designed in the shape of a bow.

8. The amplifier component according to claim 1, wherein the connecting lug is designed in a curved manner.

9. The amplifier component according to claim 1, wherein the connecting lug is designed in a meandering shape.

10. The amplifier component according to claim 1, wherein the connecting contact provides a hollow-groove design in order to achieve a high connection strength in the soldering process.

11. The amplifier component according to claim 1, wherein the amplifier elements are arranged close to the connecting contacts of the housing.

12. The amplifier component according to claim 11, wherein the amplifier elements are connected directly to a flange.

13. The amplifier component according to claim 1, wherein both amplifier elements are controlled in phase opposition and are arranged in a push-pull configuration.

14. The amplifier component according to claim 1, wherein the amplifier elements are transistor dies and each transistor die provides at least one power transistor.

15. The amplifier component according to claim 14, wherein two drain connections of the two power transistors are connected to one another via the compensation element.

* * * * *